United States Patent
Chen et al.

(10) Patent No.: US 11,127,466 B2
(45) Date of Patent: Sep. 21, 2021

(54) READ DATA SORTING METHOD AND STORAGE DEVICE FOR SEQUENTIALLY TRANSMITTING READ DATA OF CONTINUOUS LOGIC BLOCK ADDRESSES TO HOST

(71) Applicant: Shenzhen EpoStar Electronics Limited CO., Shenzhen (CN)

(72) Inventors: Tsan-Lin Chen, Hsinchu County (TW); Chih-Jhen Chen, Hsinchu County (TW)

(73) Assignee: Shenzhen EpoStar Electronics Limited CO., Shenzhen (CN)

( * ) Notice: Subject to any disclaimer, the term of this patent is extended or adjusted under 35 U.S.C. 154(b) by 0 days.

(21) Appl. No.: 16/503,641

(22) Filed: Jul. 5, 2019

(65) Prior Publication Data

US 2020/0168281 A1 May 28, 2020

(30) Foreign Application Priority Data

Nov. 26, 2018 (TW) ................................. 107142111

(51) Int. Cl.
| | | |
|---|---|---|
| G11C 16/10 | (2006.01) | |
| G11C 11/4096 | (2006.01) | |
| G06F 3/06 | (2006.01) | |
| G11C 7/10 | (2006.01) | |
| G11C 8/04 | (2006.01) | |

(52) U.S. Cl.
CPC .......... *G11C 16/107* (2013.01); *G06F 3/0619* (2013.01); *G06F 3/0656* (2013.01); *G06F 3/0659* (2013.01); *G06F 3/0679* (2013.01); *G11C 7/1012* (2013.01); *G11C 7/1057* (2013.01); *G11C 8/04* (2013.01); *G11C 11/4096* (2013.01); *G06F 2212/7203* (2013.01)

(58) Field of Classification Search
CPC . G11C 16/107; G11C 11/4096; G06F 3/0619; G06F 3/0659; G06F 3/0679
See application file for complete search history.

(56) References Cited

U.S. PATENT DOCUMENTS

| | | | |
|---|---|---|---|
| 8,856,438 B1 * | 10/2014 | Warner | G06F 3/0676 |
| | | | 711/112 |
| 10,339,045 B2 * | 7/2019 | Chu | G06F 3/061 |
| 2008/0056017 A1 * | 3/2008 | Suzuki | G11C 7/1006 |
| | | | 365/189.05 |
| 2008/0063078 A1 * | 3/2008 | Futenma | H04N 19/63 |
| | | | 375/240.19 |

(Continued)

*Primary Examiner* — Mushfique Siddique
(74) *Attorney, Agent, or Firm* — JCIPRNET (57) ABSTRACT

A read data sorting method and a storage device are provided. The read data sorting method includes: receiving a read command to read multiple logic block addresses (LBAs), wherein the LBAs are continuous; initializing an address counter as an initial logic block address of the LBAs; storing a first logic block address in a sorting buffer and set a tag corresponding to the first logic block address as valid when a first data corresponding to the first logic block address of the LBAs is transmitted to the data buffer; and transmitting a second data corresponding to a second logic block address to a host and accumulating the address counter when the tag corresponding to the second logic block address of the LBAs in the sorting buffer is valid and the second logic block address equals to the address counter.

3 Claims, 11 Drawing Sheets

(56) References Cited

U.S. PATENT DOCUMENTS

| | | | | |
|---|---|---|---|---|
| 2011/0131375 | A1* | 6/2011 | Noeldner | G06F 3/00 |
| | | | | 711/114 |
| 2013/0166855 | A1* | 6/2013 | Batwara | G06F 9/5016 |
| | | | | 711/154 |
| 2014/0237170 | A1* | 8/2014 | Okita | G06F 12/0246 |
| | | | | 711/103 |
| 2015/0019797 | A1* | 1/2015 | Huang | G06F 3/0679 |
| | | | | 711/103 |
| 2016/0291868 | A1* | 10/2016 | Halaharivi | G06F 3/0659 |
| 2016/0357483 | A1* | 12/2016 | Okita | G06F 3/0604 |
| 2020/0050370 | A1* | 2/2020 | Ji | G06F 3/064 |

* cited by examiner

READ DATA SORTING METHOD AND STORAGE DEVICE FOR SEQUENTIALLY TRANSMITTING READ DATA OF CONTINUOUS LOGIC BLOCK ADDRESSES TO HOST

CROSS-REFERENCE TO RELATED APPLICATION

This application claims the priority benefit of Taiwan application serial no. 107142111, filed on Nov. 26, 2018. The entirety of the above-mentioned patent application is hereby incorporated by reference herein and made a part of this specification.

BACKGROUND

Technical Field

The disclosure relates to a read data sorting method and a storage device, and particularly to a read data sorting method and a storage device that are capable of transmitting read data of continuous logic block addresses to a host sequentially.

In a highly efficient storage device, an output read data sequence may be interrupted by the location of data or bus resources. Some interfaces of the hosts does not support the output of non-ordering read data sequence; and extra firmwares are needed in the hosts to rearrange the non-ordering read data sequence. Without the abovementioned firmwares, read errors may occur to the hosts.

Figure 1:
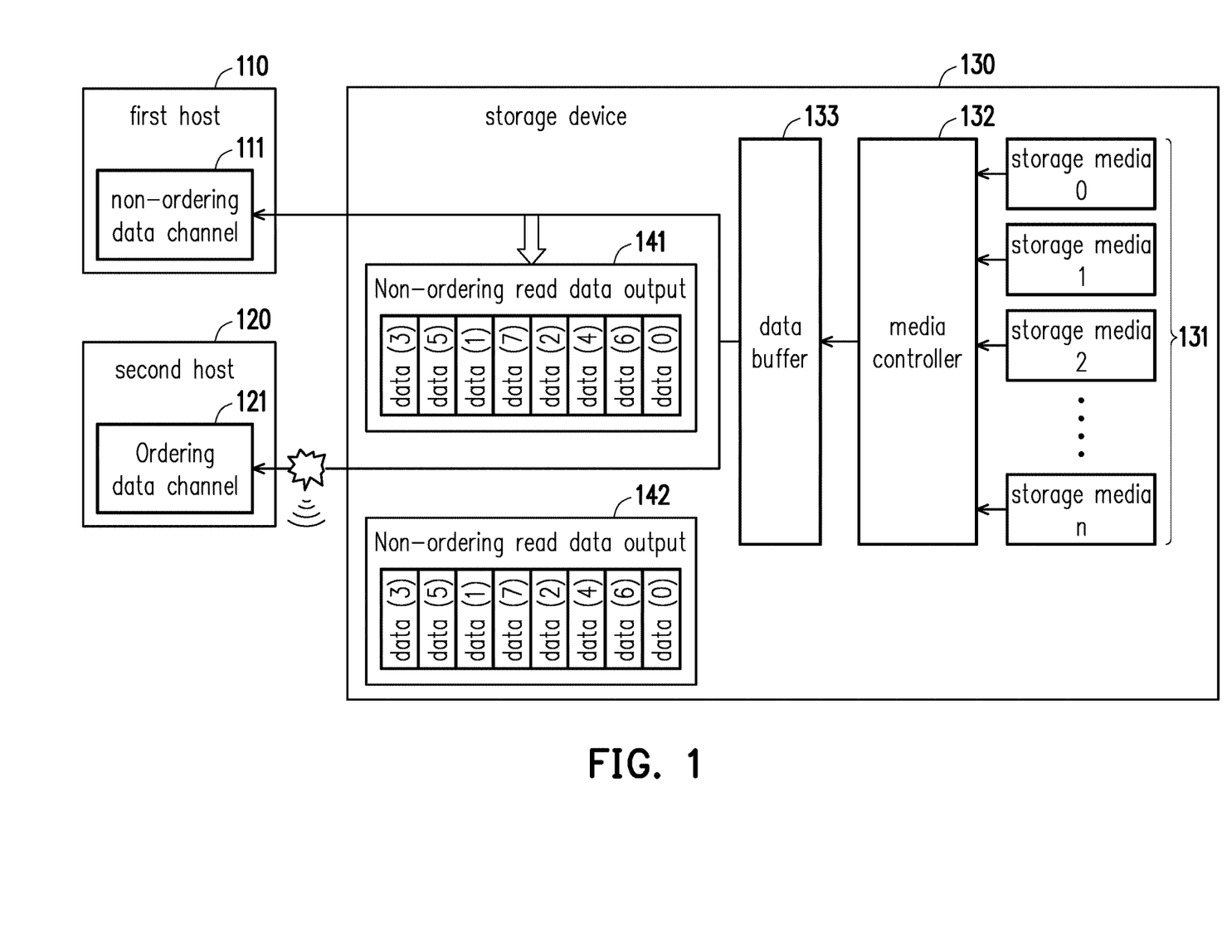
FIG. 1 is a schematic view of a known storage device.

Take FIG. 1 for instance. When a first host 110 or a second host 120 transmit a read command to a storage device 130, a media controller 132 may transmit read data from a storage media 131 to a data buffer 133. However, the output data sequence may become a non-ordering read data output 141 and non-ordering read data output 142 due to the different speeds of the read channel. When the first host 110 has a non-ordering data channel 111, the first host 110 may correctly process the non-ordering read data output 141. However, when the second host 120 has only an ordering data channel 121, the second host 120 may only receive the ordering read data output of data (0), data (1), . . . , data (7). Therefore, the second host 120 may cause a system failure when receiving the non-ordering read data output 142. Thus, how to output the read data to the host sequentially should be a goal that persons skilled in the art dedicate to achieve.

SUMMARY

The disclosure provide a read data sorting method and storage device, allowing read data to be output to a host.

The disclosure provide a read data sorting method including: receiving a read command to read multiple logic block addresses, wherein the logic block addresses are continuous; initializing an address counter as an initial logic block address of the logic block addresses; storing a first logic block address in a sorting buffer and setting a tag corresponding to the first logic block address as valid when a first data corresponding to the first logic block address of the logic block addresses is transmitted to a data buffer; and transmitting a second data corresponding to a second logic block address to a host and accumulating the address counter when the tag corresponding to a second logic block address of the logic block addresses in the sorting buffer is valid and the second logic block address equals to the address counter.

In an embodiment of the disclosure, the abovementioned read data sorting method further includes: when the second data is transmitted to the host, the tag corresponding to the second logic block is set as invalid.

In an embodiment of the disclosure, the size of the abovementioned sorting buffer is related to the number of the logic block addresses corresponding to the read command.

In an embodiment of the disclosure, the value of accumulating the address counter each time equals to a deviation of the directly adjacent logic block addresses.

In an embodiment of the disclosure, when the tag is set as valid, the value of the tag is 1; when the tag is set as invalid, the value of the tag is 0.

The disclosure provides a storage device including a processor, a sorting buffer coupled to the processor, and a data buffer coupled to the sorting buffer. The processor receives a read command to read multiple logic block addresses, wherein the logic block addresses are continuous. The processor initialize an address counter as an initial logic block address of the logic block addresses. When a first data corresponding to a first logic block address of the logic block addresses is transmitted to a data buffer, the processor stores the first logic block address in a sorting buffer, and set a tag corresponding to the first logic address as valid. When the tag corresponding to a second logic block address of the logic block addresses in the sorting buffer is valid and the second logic block address equals to the address counter, the processor transmits a second data corresponding to the second logic block address to a host and accumulate the address counter.

In an embodiment of the disclosure, wherein after second data is transmitted to a host, a processor sets a tag corresponding to a second logic block address as invalid.

In an embodiment of the disclosure, the size of the abovementioned sorting buffer is related to the number of logic block addresses corresponding to a read command.

In an embodiment of the disclosure, a value of accumulating an address counter equals to the deviation of the directly adjacent logic block addresses.

In an embodiment of the disclosure, when a tag is set as valid, the value of the tag is 1, and when the tag is set as invalid, the value of the tag is 0.

Based on the above, the read data sorting method and the storage device of the disclosure initialize the address counter when reading multiple logic block addresses. When the data is transmitted to the data buffer, the processor transmits the logic block addresses corresponding to the data to the sorting buffer, and set the tag of the logic block addresses as valid to represent that the data corresponding to the logic block addresses is transmitted to the data buffer. When the tag corresponding to the logic block addresses in the sorting buffer is valid and the logic block addresses equal to the address counter, the processor transmits the data corresponding to the logic block addresses to the host and accumulate the address counter. According to the abovementioned data sorting method, the read data may be output to the host according to the order of the logic block addresses.

In order to make the features and advantages of the disclosure mentioned above more understandable, embodiments will be described in detail below with reference to the accompanying drawings.

DESCRIPTION OF THE EMBODIMENTS

Figure 2:
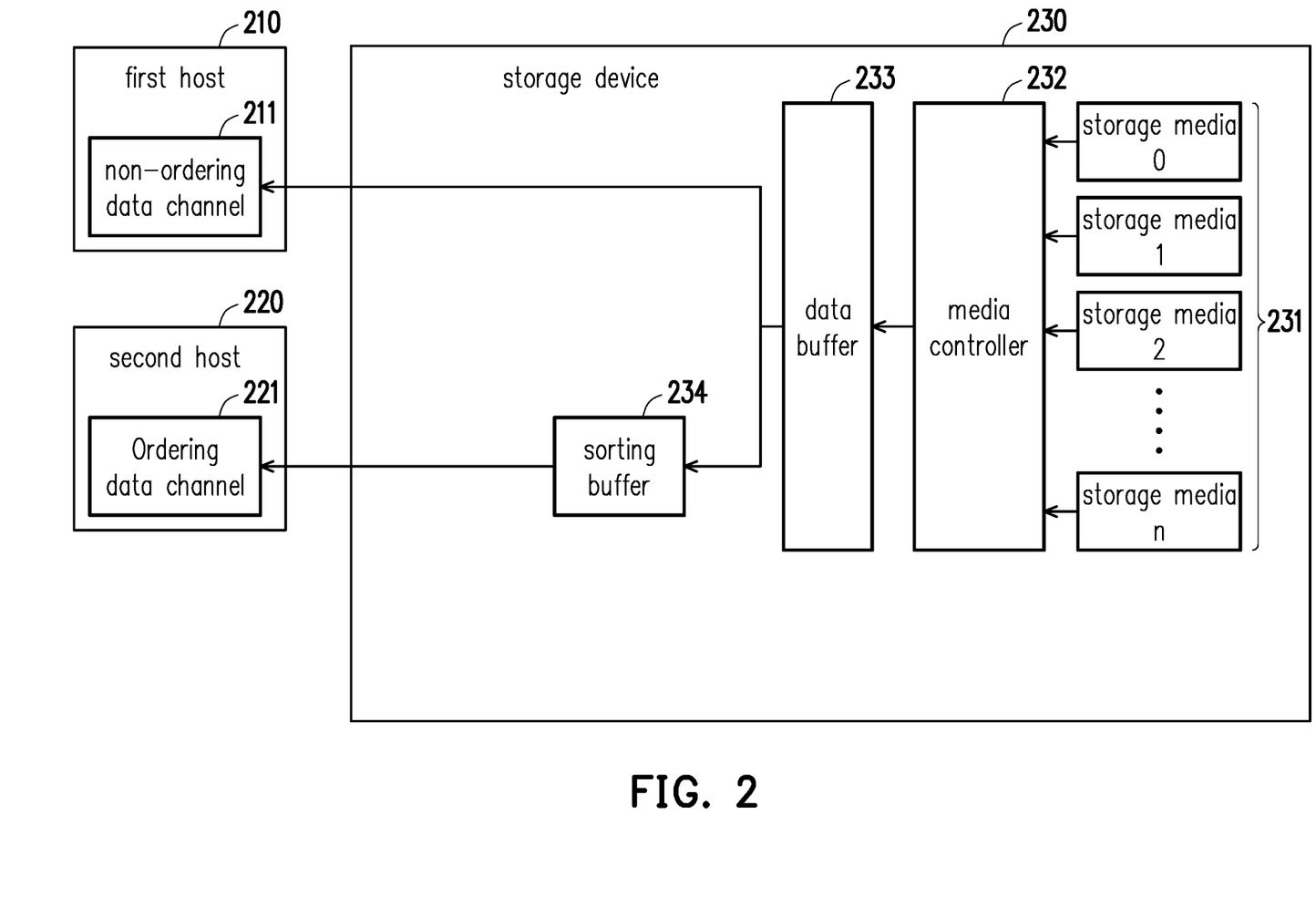
FIG. 2 is a block diagram of a storage device according to an embodiment of the disclosure.

FIG. 2 is a block diagram of a storage device according to an embodiment of the disclosure.

Please refer to FIG. 2, a storage device 230 of the disclosure includes a storage media 231, and media controller 232, a data buffer 233 and a sorting buffer 234. When a first host 210 or a second host 220 transmit a read command to the storage device 230, the media controller 232 may transmit the read data from the storage media 231 to the data buffer 233. When the first host 210 has a non-ordering data channel 211, the read data may be transmitted directly from the data buffer 233 to the non-ordering data channel 211. In other words, when a read data enters the data buffer 233, the read data may be transmitted to the non-ordering data channel 211 of the first host 210 immediately. When the second host 210 has an ordering data channel 221, an operation of the sorting buffer 234 needs to be performed to allow the read data in the data buffer 233 to be transmitted to the ordering data channel 221 of the second host 220 according to the predetermined order. The storage device 230 may include one to multiple processors (not shown in the drawings) to be in charge of the commands of input and output of the host or processes of other types of orders.

FIG. 3A to FIG. 3H is an example of read data sorting method according to an embodiment of the disclosure.

In FIG. 3A to FIG. 3H, assuming that a second host 220 transmits a read command to read the data of logical block addresses LBA (0), LBA (1), LBA (2) and LBA (3), which are data (0), data (1), data (2) and data (3) respectively. When the storage device 230 obtain the second host 220 having the data of ordering data channel 221, the storage device 230 may initialize an address counter as a logic block address LBA (0) such as an initial address of a LBA (0).

Figure 3A:
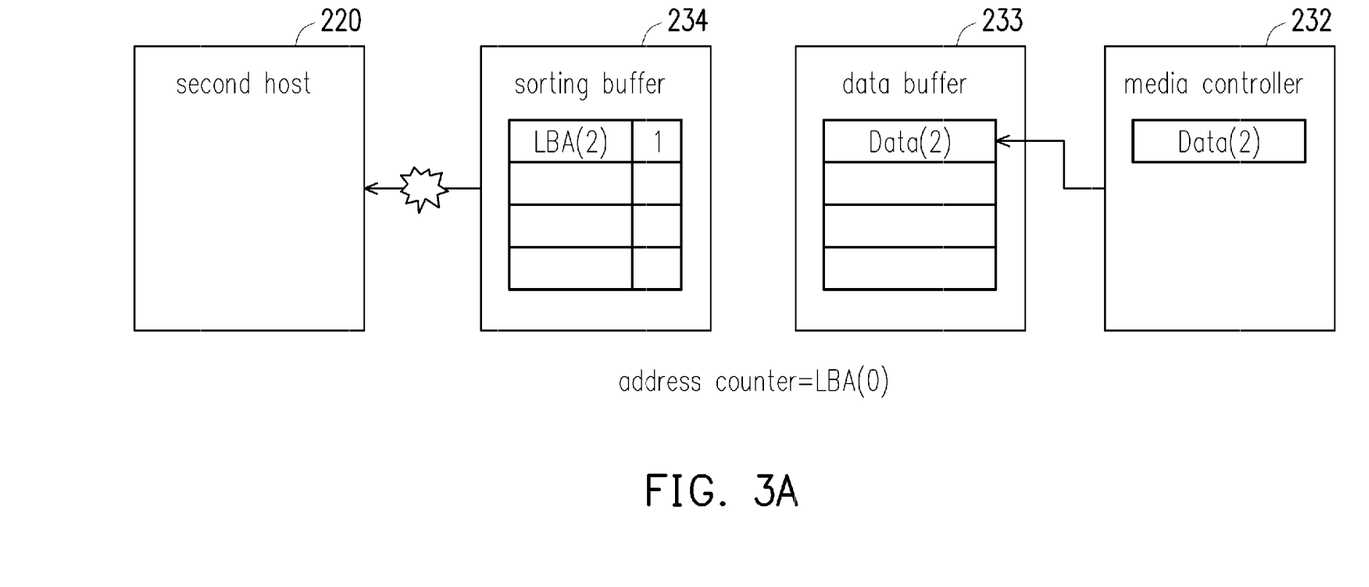
FIG. 3A to FIG. 3H is a schematic view of a read data sorting method according to an embodiment of the disclosure.

In FIG. 3A, the data (2), may be transmitted to the data buffer 233 from a media controller 232. The sorting buffer 234 may store the LBA (2) and set a tag corresponding to the LBA (2) as valid (for example, 1). The tag being set as valid represent that the data (2) corresponding to the LBA (2) have been temporarily stored in the data buffer 233. Since the LBA (2) does not equal to the value of the current address counter, the data (2) may not be transmitted to the second host 220.

Figure 3B:
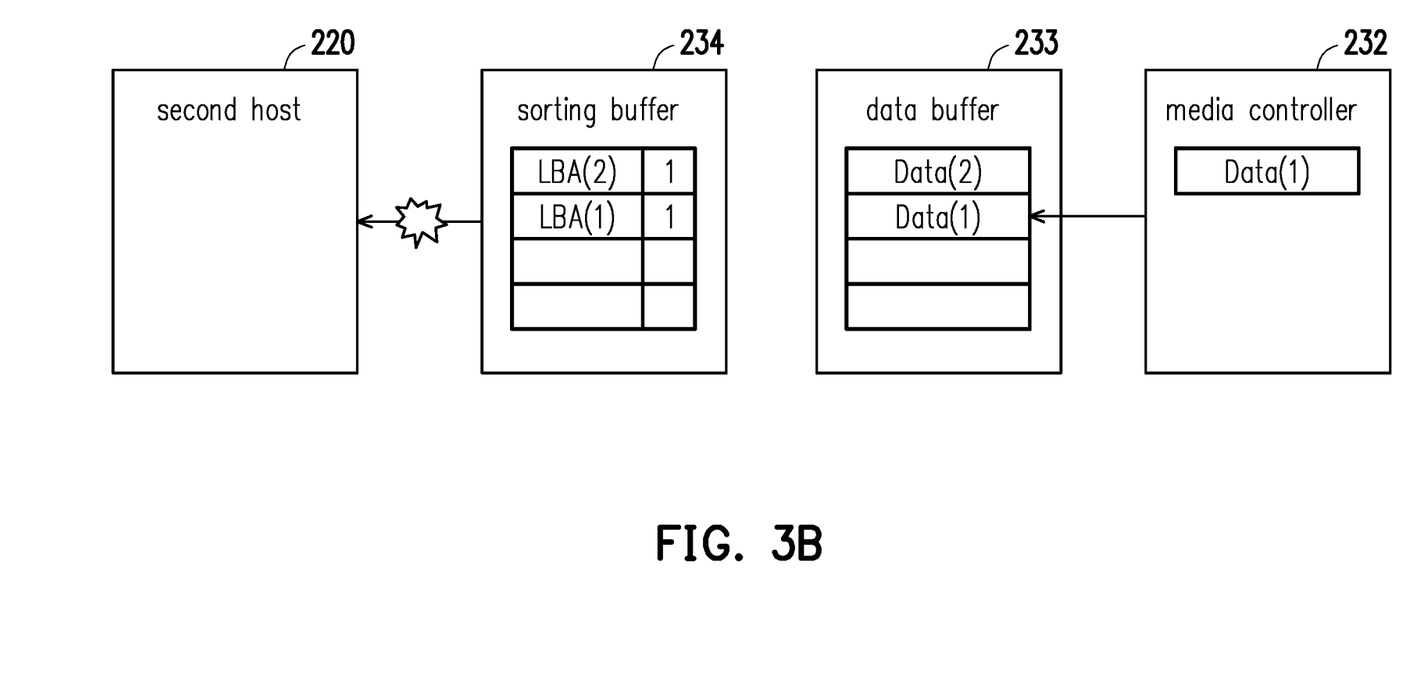

In FIG. 3B, the data (1) is transmitted to the data buffer 233 from the media controller 232. Thus, the sorting buffer 234 may store the LBA (1) and set the tag corresponding to the LBA (1) as valid (for example, 1). Since LBA (1) does not equal to the value of the current address counter, the data (1) may not be transmitted to the second host 220.

Figure 3C:
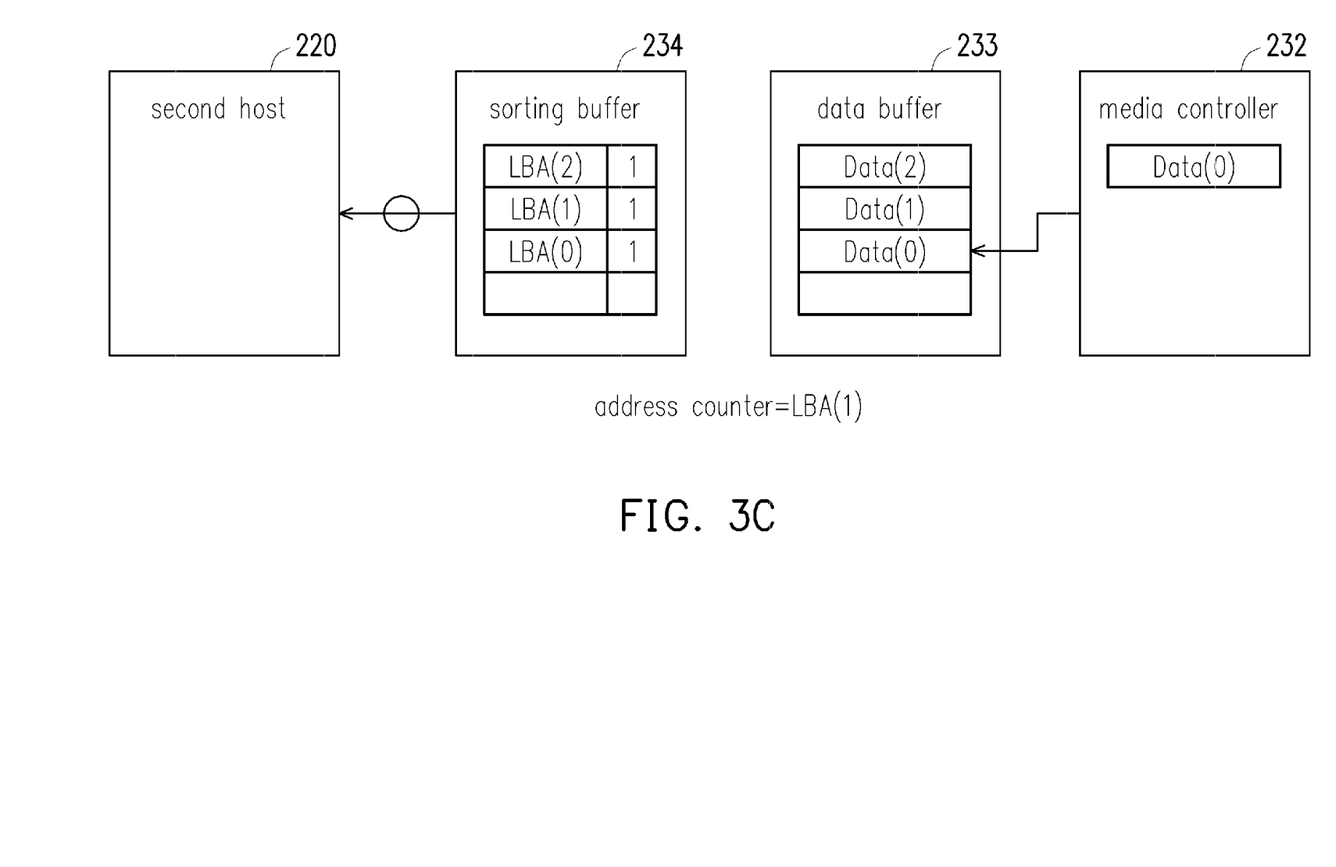
Figure 3D:
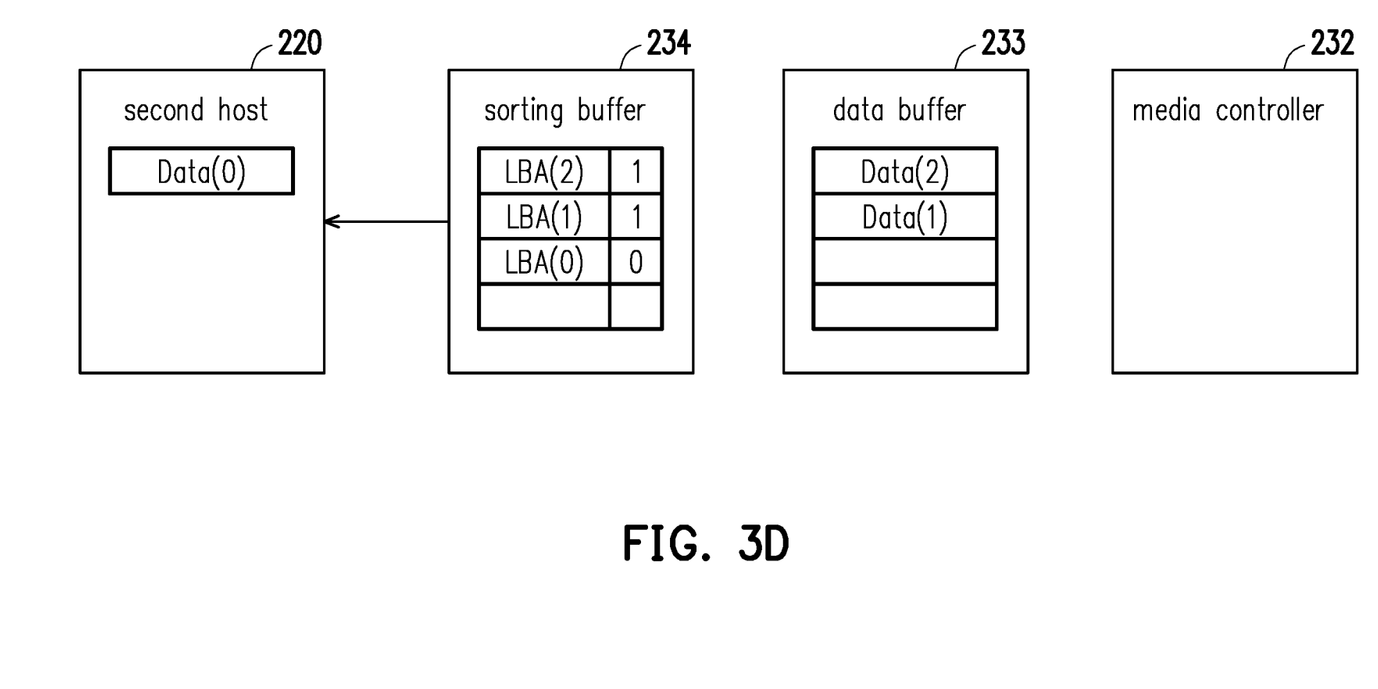

In FIG. 3C, the data (0) is transmitted to the data buffer 233 from the media controller 232. Thus, the sorting buffer 234 may store the LBA (0) and set the tag corresponding to the LBA (0) as valid (for example, 1). Since the LBA (0) equals to the value of the current address counter and the tag corresponding to the LBA (0) in the sorting buffer is 1, the data (0) may be transmitted to the second host 220 from the data buffer 233 as shown in FIG. 3D. After the data (0) is transmitted to the second host 220, the tag corresponding to the LBA (0) in the sorting buffer 234 may be set as invalid (for example, 0), and the address counter may be accumulated. For example, the address counter is set as the LBA (1) to represent the logic block address of the data that is going to be transmitted next.

In an embodiment, the address counter may be initialized as 0 and added by 1 in each accumulation. Under this kind of circumstance, the value of the address counter represent the number the logic block address among the continuous logic block addresses corresponding to the read command. For examples, the address counter 0 corresponds to LBA (0) and the address counter 1 corresponds to LBA (1) and so on. In another embodiment, when the read command corresponds to LBA (4), LBA (5), LBA (6) and LBA (7), the address counter is 0 corresponding to the LBA (4), the address counter is 1 corresponding to the LBA (5), and so on.

Figure 3E:
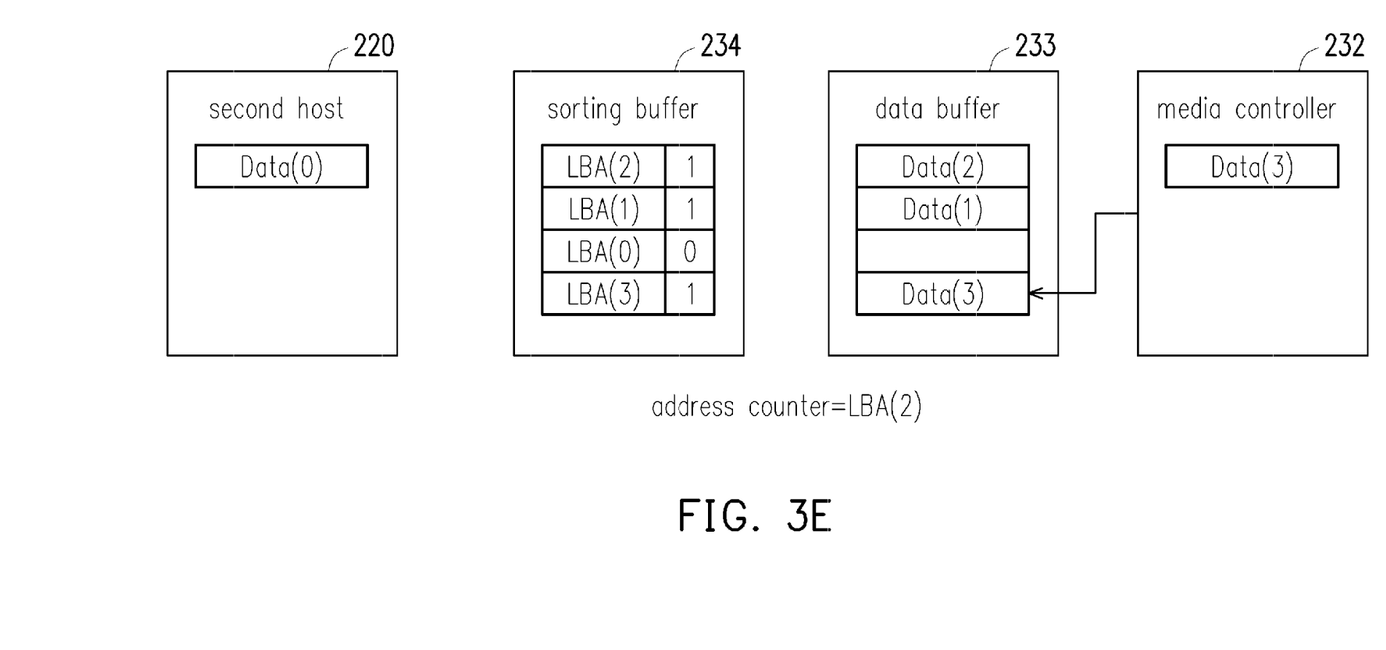
Figure 3F:
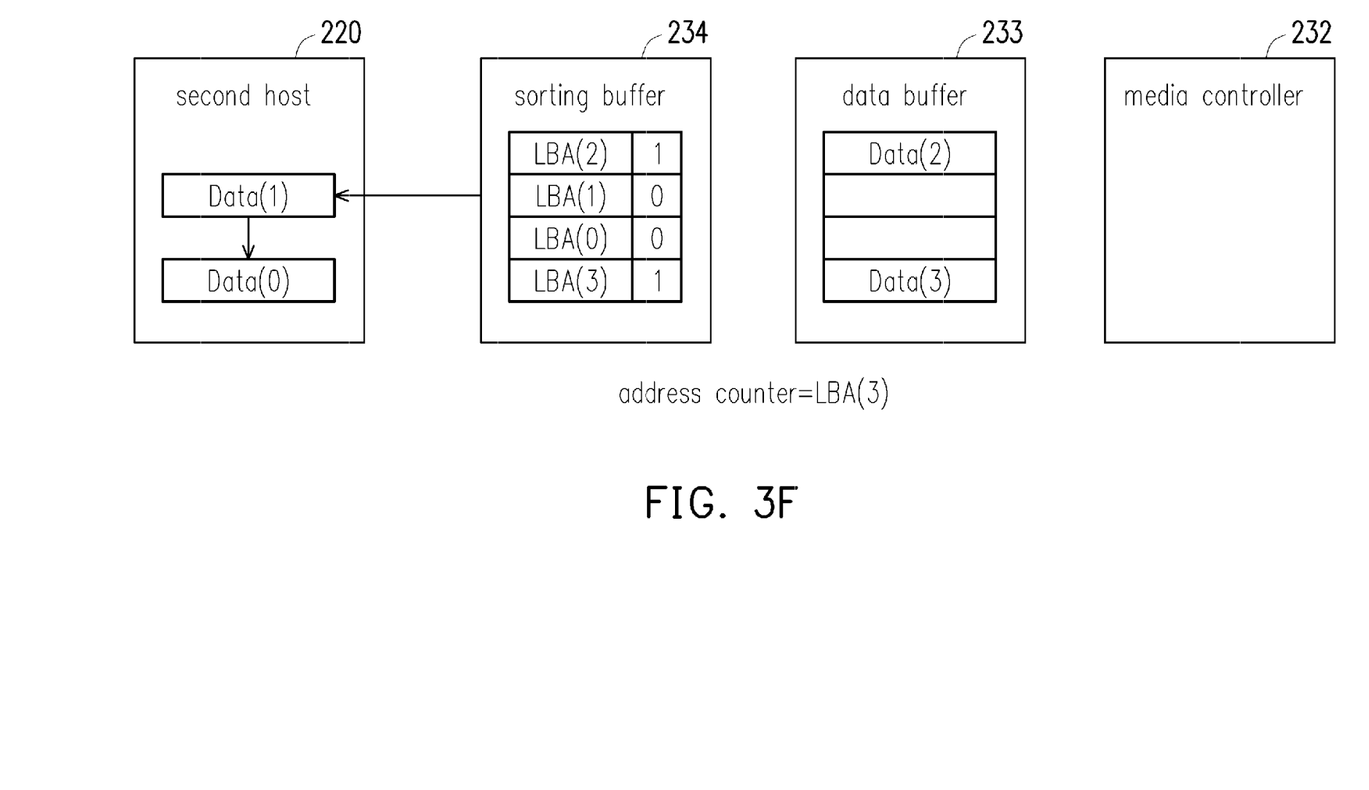

In FIG. 3E, the data (3) is transmitted to the data buffer 233 from the media controller 232. Thus, the sorting buffer 234 may store the LBA (3) and set the tag corresponding to the LBA (3) as valid (for example, 1). Since LBA (1) equals to the value of the current address counter and the tag corresponding to the LBA (1) in the sorting buffer 234 is 1, the data (1) may be transmitted to the second host 220 from the data buffer 233 as shown in FIG. 3F. After the data (1) is transmitted to the second host 220, the tag corresponding to the LBA (1) in the sorting buffer 234 may be set as invalid (for example, 0), and the address counter may be accumulated. For example, the address counter is set as LBA (2) to represent the logic block address of the data that is going to be transmitted next.

Figure 3G:
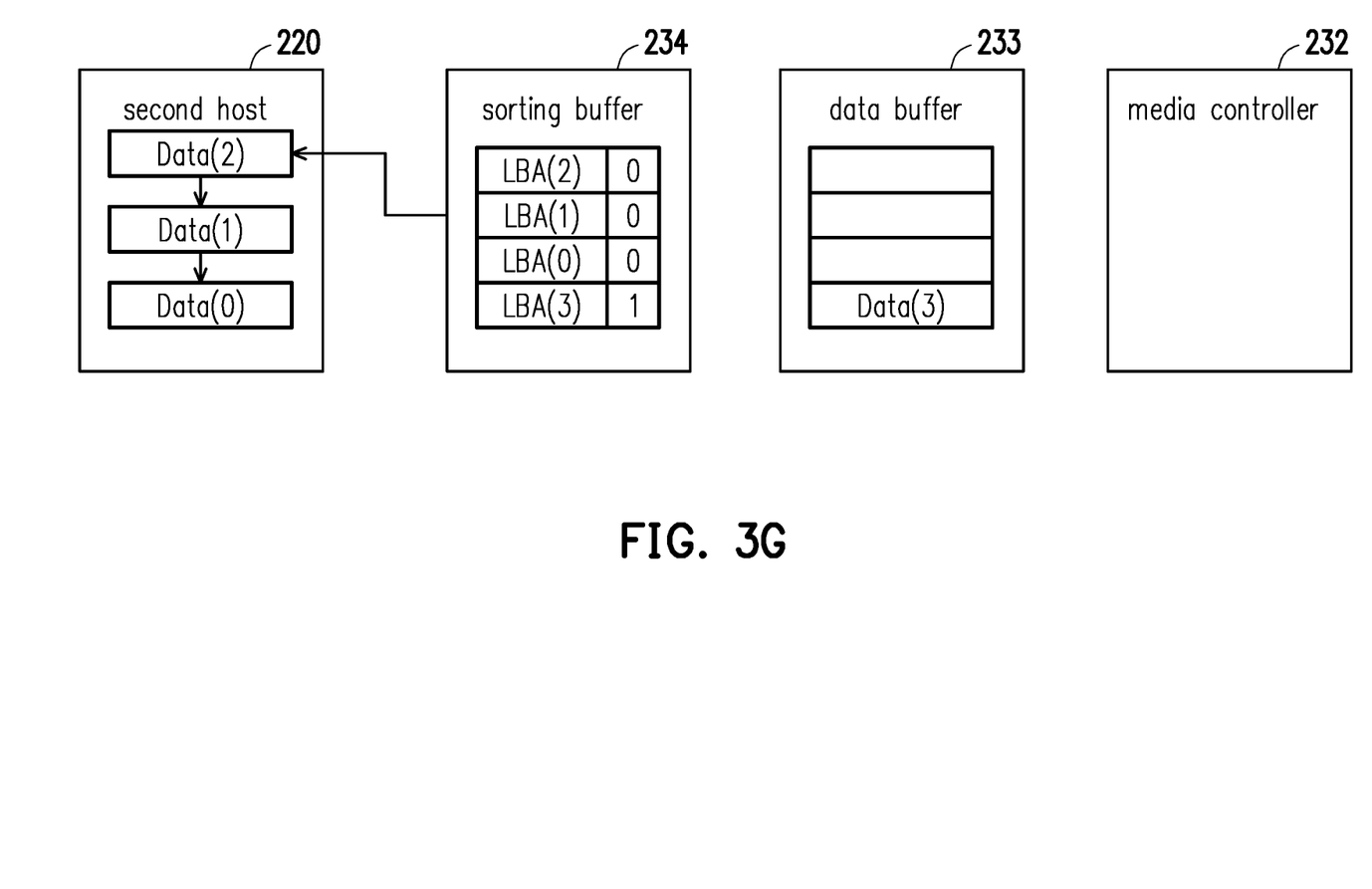
Figure 3H:
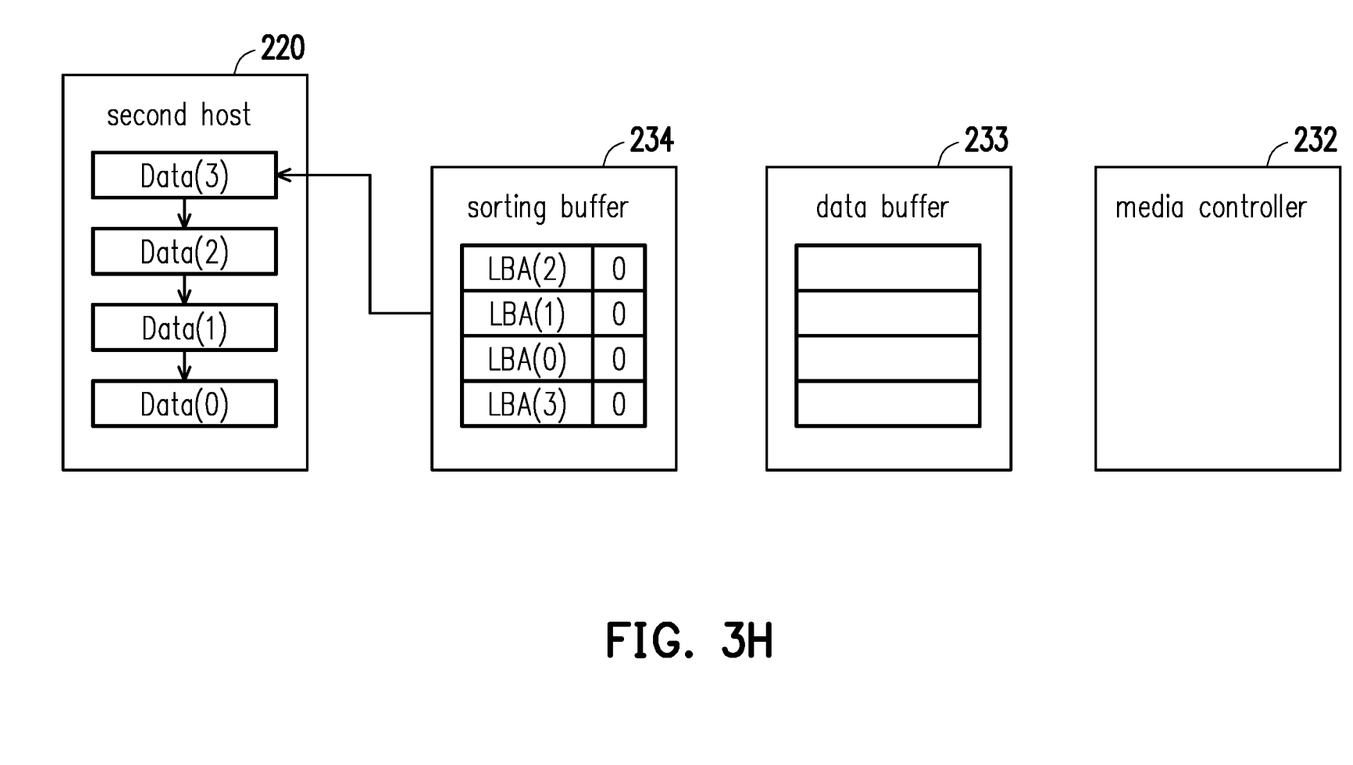

In FIG. 3F, since the LBA (2) equals to the value of the current address counter and the tag corresponding to the LBA (2) in the sorting buffer 234 is 1, the data (2) may be transmitted to the second host 220 from the data buffer 233 as shown in FIG. 3G. After the data (2) is transmitted to the second host 220, the tag corresponding to the LBA (2) in the sorting buffer 234 may be set as invalid (for example, 0), and the address counter may be accumulated. For example, the address counter is set as LBA (3) to represent the logic block address of the data that is going to be transmitted next.

In FIG. 3G, since LBA (3) equals to the value of the current address counter and the tag corresponding to the LBA (3) in the sorting buffer 234 is 1, the data (3) may be transmitted to the second host 220 from the data buffer 233. Therefore, the data (0), data (1), data (2) and data (3) may be transmitted to the second host 220 according to the order of the read data sorting method of an embodiment of the disclosure, so that errors may not occur to the second host 220 having the ordering data channel 221.

It is worth noting that the size of the sorting buffer 234 needs to be designated as being able to store at most the number of the logic block addresses read by the read command, so as to contain all the logic block addresses corresponding to the read command in the worst scenario such as the scenario of the data (0) being transmitted to the data buffer 233 at last as shown in the examples of FIGS. 3A to 3H.

Figure 4:
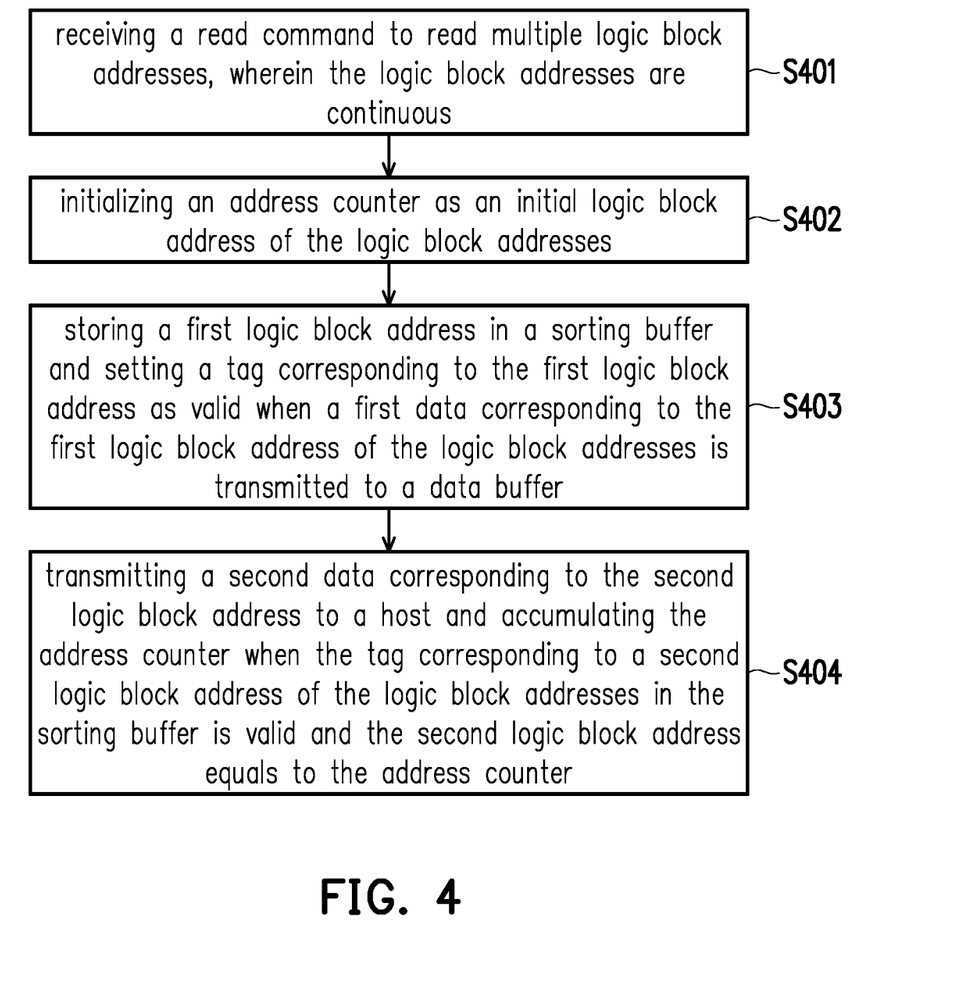
FIG. 4 is a process chart of a read data sorting method according to an embodiment of the disclosure.

FIG. 4 is a process chart of a read data sorting method according to an embodiment of the disclosure.

Please refer to FIG. 4, in step S401, a read command is received to read multiple logic block addresses, wherein the logic block addresses are continuous.

In step S402, an address counter is initialized as an initial logic block address of the logic block addresses.

In step S403, when a first data corresponding to a first logic block address of the logic block addresses is transmitted to the data buffer, the first logic block address is stored in a sorting buffer and a tag corresponding to the first logic block address is set as valid.

In step S404, when a tag corresponding to a second logic block address of the logic block addresses in the sorting buffer is valid and the second logic block address equals to the address counter, a second data corresponding to the second logic block address is transmitted to the host and the address counter is accumulated.

Based on the above, the read data sorting method and storage device of the disclosure may initialize the address counter when reading multiple logic block addresses. When the data is transmitted to the data buffer, the processor may transmit the logic block address corresponding to the data to the sorting buffer, and set the tag of the logic block address as valid to represent the data corresponding to the logic block address. When the tag corresponding to the logic block address in the sorting buffer is valid and the logic block address equals to the address counter, the processor may transmit the data corresponding to the logic block address to the host the accumulate the address counter. According to the data sorting method above, the read data may be transmitted to the host according to the order of the logic block addresses.

Although the disclosure has been disclosed in the above embodiments, the embodiments are not intended to limit the disclosure, and those skilled in the art may make some modifications and refinements without departing from the spirit and scope of the disclosure. Therefore, the scope of the disclosure is defined by the claims attached below.

What is claimed is:

1. A read data sorting method comprising:
receiving a read command to read multiple logic block addresses, wherein these logic block addresses are continuous;
initializing an address counter as an initial logic block address of the logic block addresses, wherein when the address counter is less than or equal to an end logic block address of the logic block addresses, the following steps are performed:
saving a first logic block address in a sorting buffer and setting a tag corresponding to the first logic address as valid when a first data corresponding to the first logic block address of the logic block addresses is transmitted to a data buffer; and
transmitting a second data corresponding to a second logic block address to a host and accumulating the address counter when the tag corresponding to the second logic block address of the logic block addresses in the sorting buffer is valid and the second logic block address equals to the address counter, wherein the value of accumulating the address counter each time equals to the deviation of the directly adjacent logic block addresses, and
setting the tag corresponding to the second logic block address as invalid after the second data is transmitted to the host.

2. The read data sorting method according to claim 1, wherein the size of the sorting buffer is related to the number of the logic block addresses corresponding to the read command.

3. The read data sorting method according to claim 1, wherein when the tag is set as valid, the value of the tag is 1; when the tag is set as invalid, the value of the tag is 0.

* * * * *